(12) United States Patent
Wang et al.

(10) Patent No.: US 10,314,186 B2
(45) Date of Patent: Jun. 4, 2019

(54) CONDUCTIVE COVER, HOUSING ASSEMBLY AND TERMINAL

(71) Applicant: GUANGDONG OPPO MOBILE TELECOMMUNICATIONS CORP., LTD., Dongguan (CN)

(72) Inventors: Xinbao Wang, Dongguan (CN); Ning Zhao, Dongguan (CN); Liang Gu, Dongguan (CN)

(73) Assignee: GUANGDONG OPPO MOBILE TELECOMMUNICATIONS CORP., LTD., Dongguan, Guangdong (CN)

( * ) Notice: Subject to any disclaimer, the term of this patent is extended or adjusted under 35 U.S.C. 154(b) by 0 days.

(21) Appl. No.: 15/688,558

(22) Filed: Aug. 28, 2017

(65) Prior Publication Data

US 2018/0192530 A1    Jul. 5, 2018

(30) Foreign Application Priority Data

Jan. 4, 2017   (CN) .......................... 2017 1 0005371
Jan. 4, 2017   (CN) .......................... 2017 2 0009555

(51) Int. Cl.
*H01Q 1/24*     (2006.01)
*H01Q 3/24*     (2006.01)
(Continued)

(52) U.S. Cl.
CPC .......... *H05K 5/0247* (2013.01); *H01Q 1/243* (2013.01); *H01Q 5/35* (2015.01); *H01Q 5/364* (2015.01);
(Continued)

(58) Field of Classification Search
None
See application file for complete search history.

(56) References Cited

U.S. PATENT DOCUMENTS

2006/0038736 A1*   2/2006   Hui ..................... H01Q 1/243
                                                  343/835
2009/0096677 A1*   4/2009   Chang ................. H01Q 1/38
                                                  343/700 MS
(Continued)

FOREIGN PATENT DOCUMENTS

CN           100556254 C      10/2009
CN           105655704 A       6/2016
(Continued)

OTHER PUBLICATIONS

IPhone 6, YouTube, 2014 https://www.youtube.com/watch?v=Km0QmJNRAy8.*

(Continued)

*Primary Examiner* — Jianxun Yang
(74) *Attorney, Agent, or Firm* — Lathrop Gage LLP

(57) ABSTRACT

The present disclosure provides a conductive cover, a housing assembly and a terminal. The conductive cover includes a first portion, a second portion, a conductive suspended strip and a conductive connecting member. A slot is defined between the second portion and the first portion. The conductive suspended strip is located in the slot and has a length equal to a length of the slot. An insulating layer is provided between the conductive suspended strip and the first portion, and another insulating layer is provided between the conductive suspended strip and the second portion. The conductive connecting member bridges over the slot, is electrically connected with the first portion and the second portion, and is insulated from the conductive suspended strip.

19 Claims, 5 Drawing Sheets

(51) Int. Cl.

| | | |
|---|---|---|
| *H01Q 5/35* | (2015.01) | |
| *H01Q 9/40* | (2006.01) | |
| *H01Q 9/42* | (2006.01) | |
| *H05K 5/00* | (2006.01) | |
| *H05K 5/02* | (2006.01) | |
| *H05K 5/03* | (2006.01) | |
| *H05K 7/02* | (2006.01) | |
| *H05K 7/14* | (2006.01) | |
| *H01Q 21/28* | (2006.01) | |
| *H01Q 5/364* | (2015.01) | |

(52) U.S. Cl.
CPC ............ *H01Q 9/40* (2013.01); *H05K 5/0004* (2013.01); *H05K 5/0026* (2013.01); *H05K 5/0086* (2013.01); *H05K 5/0217* (2013.01); *H05K 5/03* (2013.01); *H05K 7/02* (2013.01); *H05K 7/1428* (2013.01); *H01Q 3/247* (2013.01); *H01Q 9/42* (2013.01); *H01Q 21/28* (2013.01)

(56) References Cited

U.S. PATENT DOCUMENTS

| 2009/0189815 A1* | 7/2009 | Hotta ..................... H01Q 1/243 343/700 MS |
| 2016/0064820 A1* | 3/2016 | Kim ....................... H01Q 1/243 343/767 |
| 2016/0336653 A1* | 11/2016 | Paulotto ............... H01Q 9/0421 |

FOREIGN PATENT DOCUMENTS

| CN | 105742812 A | 7/2016 |
| CN | 105789827 A | 7/2016 |
| CN | 105870598 A | 8/2016 |
| CN | 105914450 A | 8/2016 |
| CN | 105932398 A | 9/2016 |
| CN | 106025508 A | 10/2016 |
| CN | 205754460 U | 11/2016 |
| CN | 106210200 A | 12/2016 |
| CN | 106785353 A | 5/2017 |
| CN | 106785436 A | 5/2017 |
| CN | 206332162 U | 7/2017 |
| CN | 206332181 U | 7/2017 |
| WO | WO 2013155215 A1 | 10/2013 |

OTHER PUBLICATIONS

PCT/CN2017/098864 English translation of the International Search Report and Written Opinion dated Nov. 22, 2017, 15 pages.
Chinese Patent Application No. 201710005371.2, Office Action dated Jul. 31, 2018, 7 pages.
Chinese Patent Application No. 201710005371.2, English translation of Office Action dated Jul. 31, 2018, 9 pages.
Taiwanese Patent Application No. 106139184, Office Action dated Nov. 13, 2018, 7 pages.
European Patent Application No. 17186675.9, Office Action dated Apr. 12, 2019, 8 pages.

* cited by examiner

CONDUCTIVE COVER, HOUSING ASSEMBLY AND TERMINAL

CROSS-REFERENCE TO RELATED APPLICATION

This application claims priority to and benefits of Chinese Patent Application No. 201720009555.1, filed with State Intellectual Property Office on Jan. 4, 2017, and Chinese Patent Application No. 201710005371.2, filed with State Intellectual Property Office on Jan. 4, 2017, the entire content of which is incorporated herein by reference.

FIELD

The present disclosure relates to a technical field of communication equipment, and particularly, to a conductive cover, a housing assembly, and a terminal.

BACKGROUND

In the related art, for a terminal with an all-metal rear cover, in order to meet a requirement of antenna design, it is common practice to provide a slot in the rear cover to radiate a signal, but the antenna signal is susceptible to external interference in existing methods. Thus, how to enhance the antenna signal strength is one of the urgent technical problems to be solved.

SUMMARY

According to a first aspect of the present disclosure, a conductive cover for a terminal id provided. The conductive cover includes: a first portion; a second portion, a slot being defined between the second portion and the first portion to partition the first portion from the second portion; a conductive suspended strip, located in the slot and having a length equal to a length of the slot, an insulating layer being provided between the conductive suspended strip and the first portion, and another insulating layer being provided between the conductive suspended strip and the second portion; and a conductive connecting member, bridging over the slot, electrically connected with the first portion and the second portion, and insulated from the conductive suspended strip.

According to a second aspect of the present disclosure, a housing assembly for a terminal is provided. The housing assembly includes: a conductive cover according to the above, the conductive cover being divided into a plurality of spaced signal areas, and each of the plurality of signal areas comprising a part of the first portion, a part of the second portion and a part of the conductive suspended strip.

According to a third aspect of the present disclosure, a terminal is provided. The terminal includes the above housing assembly; a first antenna circuit, located in one of the plurality of signal areas and comprising a first signal source, a first matching circuit and a first inductor, one end of the first inductor being electrically connected with the first portion, the other end of the first inductor being electrically connected with one end of the first matching circuit, and the other end of the first matching circuit being electrically connected with the first signal source; a second antenna circuit, located in another one of the plurality of signal areas and comprising a second signal source, a second matching circuit and a second inductor, one end of the second inductor being electrically connected with the first portion, the other end of the second inductor being electrically connected with one end of the second matching circuit, and the other end of the second matching circuit being electrically connected with the second signal source; and a camera assembly disposed adjacent to the first antenna circuit or the second antenna circuit.

DETAILED DESCRIPTION

Figure 1:
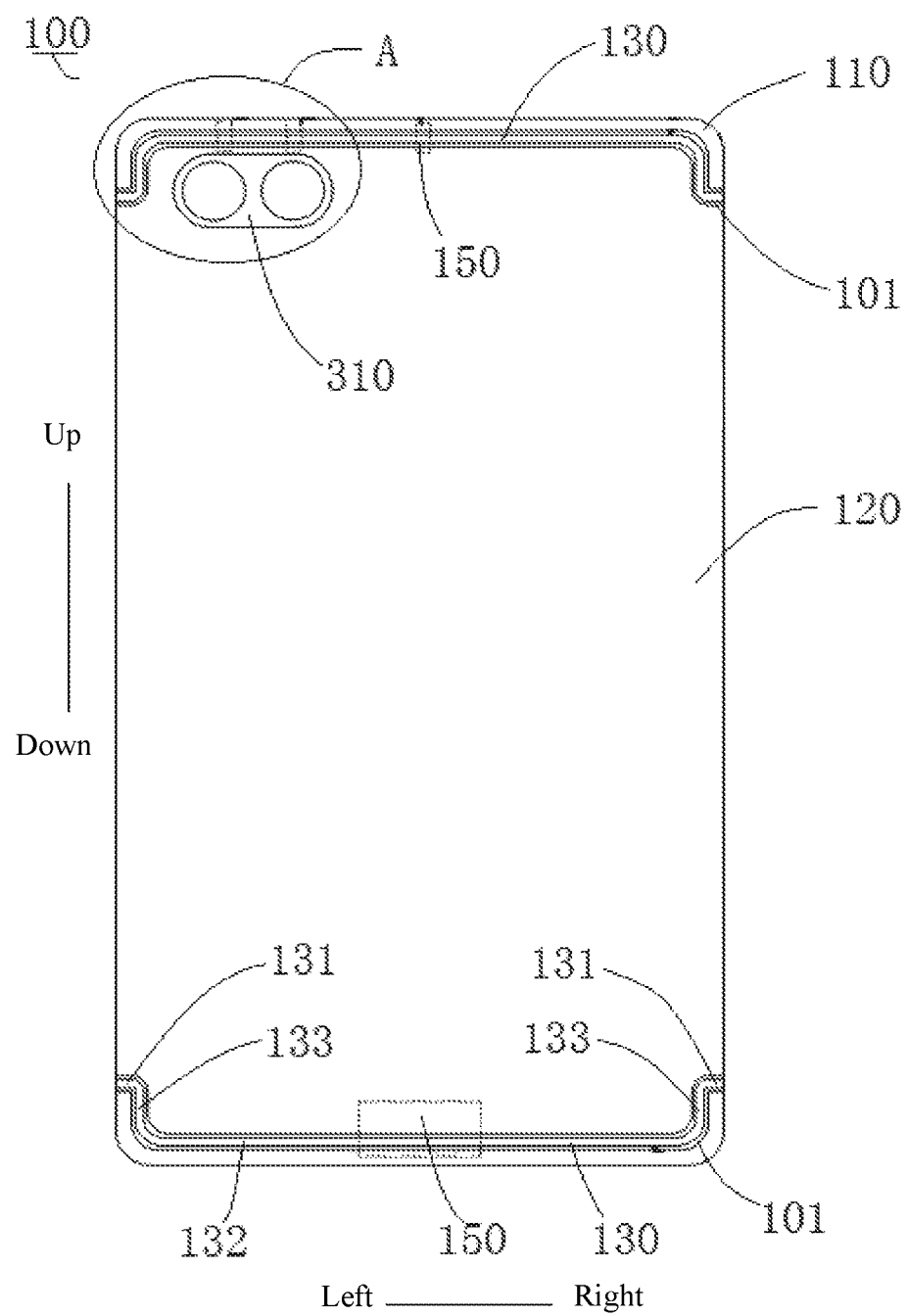
FIG. 1 is a schematic view of a conductive cover for a terminal according to an embodiment of the present disclosure.

Embodiments of the present disclosure will be described in detail and examples of the embodiments will be illustrated in the accompanying drawings. The embodiments described herein with reference to the drawings are explanatory, which aim to illustrate the present disclosure, but shall not be construed to limit the present disclosure.

In the description of the present disclosure, it is to be understood that terms such as "central," "longitudinal", "transverse", "length," "width," "thickness," "upper," "lower," "front," "rear," "left," "right," "vertical," "horizontal," "top," "bottom," "inner," "outer," "clockwise," "counterclockwise," "axial," "radial" and "circumferential" should be construed to refer to the orientation or the position as described or as illustrated in the drawings under discussion. These relative terms are only used to simplify description of the present disclosure, and do not indicate or imply that the device or element referred to must have a particular orientation, or constructed or operated in a particular orientation. Thus, these terms cannot be constructed to limit the present disclosure.

In addition, terms such as "first" and "second" are used herein for purposes of description and are not intended to indicate or imply relative importance or significance or to imply the number of indicated technical features. Thus, the feature defined with "first" and "second" can comprise one or more of this feature. In the description of the present disclosure, the term "a plurality of" means two or more than two, unless specified otherwise.

In the description of embodiments of the present disclosure, unless specified or limited otherwise, the terms "mounted," "connected," "coupled," "fixed" and the like are interpreted broadly, and can be, for example, fixed connections, detachable connections, or integral connections; can also be mechanical or electrical connections or communicated with each other; can also be direct connections or indirect connections via intervening structures; can also be inner communications or mutual interaction of two elements, which can be understood by those skilled in the art according to specific situations.

A conductive cover 100, a housing assembly 200 and a terminal 300 according to embodiments of the present disclosure will be described in detail with reference to FIGS. 1 to 5.

With reference to the drawings, the conductive cover 100 for the terminal 300 according to embodiments of the present disclosure includes a first portion 110, a second portion 120, a conductive suspended strip 130 and a conductive connecting member 150.

It should be noted that the conductive cover 100 means that a main body (e.g. the first portion 110 and the second portion 120) of the conductive cover 100 can be made of a conductive material, or can be made of an insulation material, in which case the insulating cover is subject to a conductive treatment (e.g. applying a conductive coating). In addition, the conductive cover 100 can mean that the main body (e.g. the first portion 110 and the second portion 120) of the conductive cover 100 has conductivity, or a part of the main body (e.g. the first portion 110 and the second portion 120) of the conductive cover 100 has conductivity. Correspondingly, the material and conductivity of the conductive suspended strip 130 can be interpreted similarly, which will not be elaborated herein.

Specifically, FIG. 1 illustrates that a slot 101 is defined between the second portion 120 and the first portion 110 to partition the first portion 110 from the second portion 120. The conductive suspended strip 130 is located in the slot 101 and has a length equal to a length of the slot 101. That is, the shape and size of the conductive suspended strip 130 is identical to the shape and size of the slot 101. An insulating layer 140 is provided between the conductive suspended strip 130 and the first portion 110, and another insulating layer 140 is provided between the conductive suspended strip 130 and the second portion 120. It could be understood that the conductive cover 100 is provided with the slot 101, the slot 101 penetrates through two opposite side walls of the conductive cover 100 (e.g. as illustrated in FIG. 1, the slot 101 penetrates through a left side wall and a right side wall of the conductive cover 100) to divide the conductive cover 100 into the first portion 110 and the second portion 120. The conductive suspended strip 130 is arranged in the slot 101. That is, the first portion 110, the conductive suspended strip 130 and the second portion 120 are arranged sequentially and spaced apart from each other, the first portion 110 is connected with the conductive suspended strip 130 in an insulating manner, and the conductive suspended strip 130 is connected with the second portion 120 in an insulating manner, so as to constitute a complete conductive cover 100.

Figure 2:
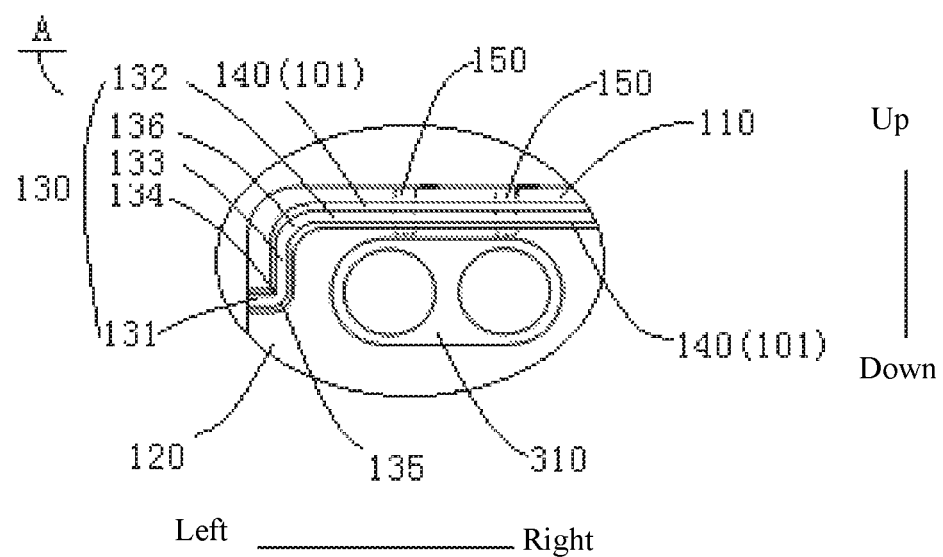
FIG. 2 is a partially enlarged view of part A in FIG. 1.

As illustrated in FIG. 2, the conductive connecting member 150 bridges over the slot 101 and is electrically connected with the first portion 110 and the second portion 120, and the conductive connecting member 150 is insulated from the conductive suspended strip 130. The first portion 110 can directly serve as an antenna component, thereby simplifying a structure of the terminal 300. Electrical connection between the first portion 110 and the second portion 120 by means of the conductive connecting member 150 can enhance a signal radiation capability of the first portion 110 or the second portion 120. The insulated connection between the conductive connecting member 150 and the conductive suspended strip 130 can prevent the conductive suspended strip 130 from interfering with signal radiation, so as to improve an anti-interference capability of an antenna, and enhance antenna signal strength.

For the conductive cover 100 for the terminal 300 according to embodiments of the present disclosure, by arranging the conductive suspended strip 130 in the slot 101 of the conductive cover 100, by electrically connecting the first portion 110 with the second portion 120 through the conductive connecting member 150, and by connecting the conductive connecting member 150 with the conductive suspended strip 130 in the insulating manner, the signal radiation capability of the first portion 110 or the second portion 120 can be enhanced, and the conductive suspended strip 130 can be prevented from interfering with the signal radiation, so as to improve the anti-interference capability of the antenna, and enhance the antenna signal strength.

In an embodiment of the present disclosure, a thickness of the insulating layer 140 can range from 0.1 mm to 0.5 mm. It is verified by experiments that when the thickness of the insulating layer 140 ranges from 0.1 mm to 0.5 mm, the terminal 300 has better signal radiation performance and stronger anti-interference capability.

As illustrated in FIG. 2, in an embodiment of the present disclosure, the conductive suspended strip 130 can include: two first horizontal segments 131 spaced apart from each other, one second horizontal segment 132, and two vertical connecting segments 133. Specifically, the second horizontal segment 132 is located between the two first horizontal segments 131, and the second horizontal segment 132 is located at a side of the two first horizontal segments 131 and parallel to the two first horizontal segments 131. An extension direction of the vertical connecting segments 133 is perpendicular to an extension direction of the two first horizontal segments 131, and two ends of each vertical connecting segment 133 are connected to one corresponding first horizontal segment 131 and the second horizontal segment 132.

For example, FIG. 1 illustrates that the conductive suspended strip 130 extends along a left-right direction. The first horizontal segments 131 and the second horizontal segment 132 extend along a horizontal direction (e.g. the left-right direction illustrated in FIG. 1), and are spaced apart from each other in an up-down direction (e.g. the up and down direction illustrated in FIG. 1). The two first horizontal segments 131 are located at two ends of the second horizontal segment 132 along the left-right direction. The vertical connecting segment 133 extends along the up-down direction (e.g. the up-down direction illustrated in FIG. 1). One of the two vertical connecting segments 133 is configured to connect to the first horizontal segment 131 located at a left side and a left end of the second horizontal segment 132, and the other one of the two vertical connecting segments 133 is configured to connect to the first horizontal segment 131 located at a right side and a right end of the second horizontal segment 132.

In an example of the present disclosure, as illustrated in FIG. 2, a side wall surface of the first horizontal segment 131 facing the first portion 110 and the corresponding vertical connecting segment 133 are at a right angle 134. For example, as illustrated in FIG. 2, the first horizontal segment 131 at the left side is connected with the vertical connecting segment 133 at the left side, and the right angle 134 is formed at a location where the side wall surface of this first horizontal segment 131 facing the first portion 110 (i.e. an upper wall surface of the first horizontal segment 131 in FIG. 2) is connected with the vertical connecting segment 133. It is verified by tests that when the side wall surface of the first horizontal segment 131 facing the first portion 110 and the corresponding vertical connecting segment 133 are at the right angle 134, the anti-interference capability of the antenna will be enhanced.

In another example of the present disclosure, as illustrated in FIG. 2, a side wall surface of the first horizontal segment 131 facing the second portion 120 and the corresponding vertical connecting segment 133 are at a rounded angle 135. For example, as illustrated in FIG. 2, the first horizontal segment 131 at the left side is connected with the vertical connecting segment 133 at the left side, and the rounded angle 135 is formed at a location where the side wall surface of this first horizontal segment 131 facing the second portion 120 (i.e. a lower wall surface of the first horizontal segment 131 in FIG. 2) is connected with the vertical connecting segment 133. It is verified by tests that when the side wall surface of the first horizontal segment 131 facing the second portion 120 and the corresponding vertical connecting segment 133 are at the rounded angle 135, the anti-interference capability of the antenna will be enhanced.

In still another example of the present disclosure, smooth-transition connecting portions 136 are provided between the second horizontal segment 132 and the vertical connecting segments 133. It could be understood that a smooth-transition connecting portion 136 is provided between the vertical connecting segment 133 at the left side and the left end of the second horizontal segment 132, and another smooth-transition connecting portion 136 is provided between the vertical connecting segment 133 at the right side and the right end of the second horizontal segment 132. For example, as illustrated in FIG. 2, the vertical connecting segment 133 at the left side and the left end of the second horizontal segment 132 are connected through an arc segment (i.e. the smooth-transition connecting portion 136). It is verified by tests that when the second horizontal segment 132 is smoothly connected with the vertical connecting segments 133, the anti-interference capability of the antenna can be enhanced.

Figure 3:
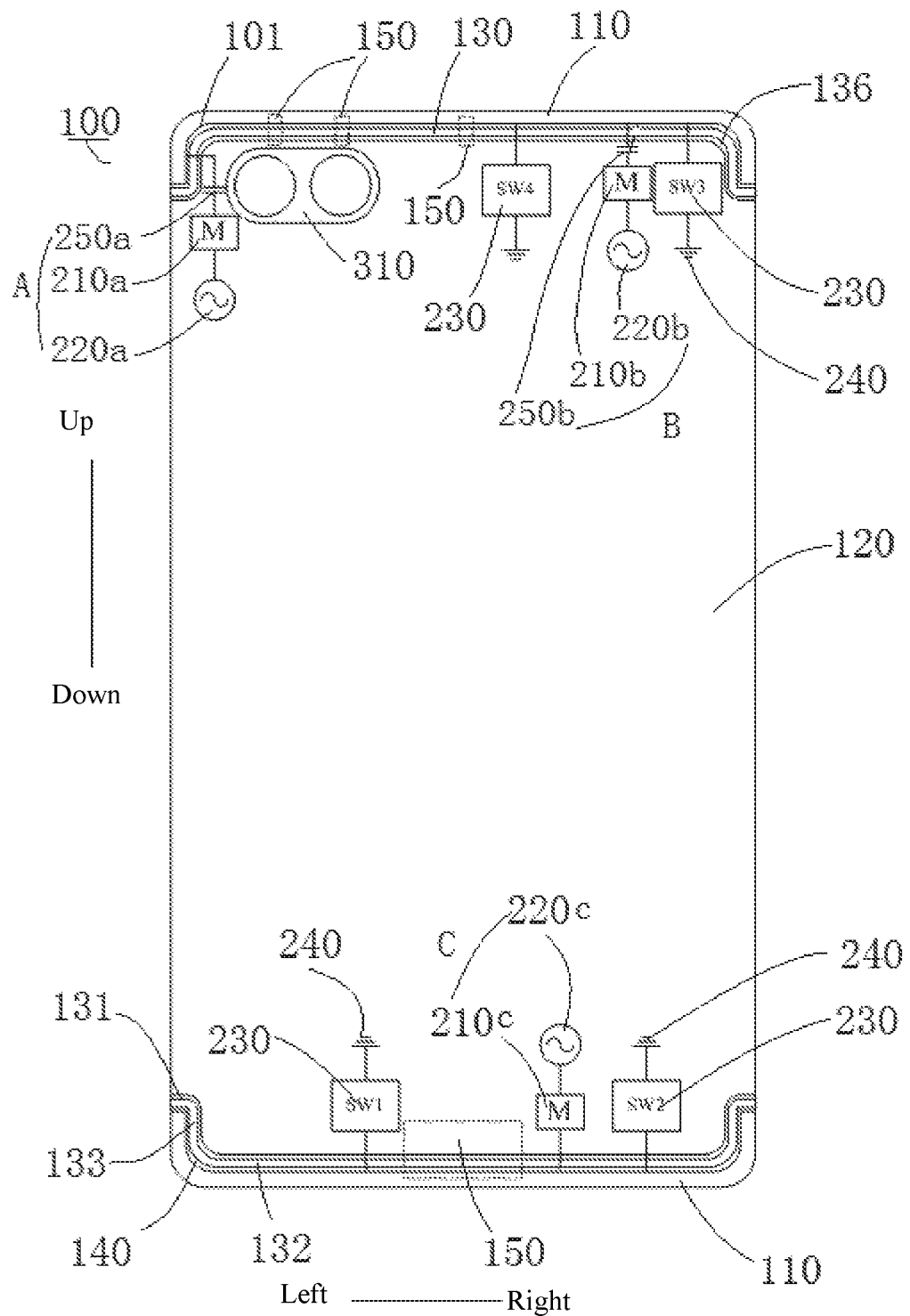
FIG. 3 is a schematic view of a conductive cover for a terminal according to an embodiment of the present disclosure.

FIG. 3 illustrates an embodiment of the present disclosure, a plurality of the conductive connecting members 150 are provided and are spaced apart from each other along a length direction of the slot 101. Thus, it is convenient to arrange a signal area 201 in the slot 101.

In an embodiment of the present disclosure, the conductive cover 100 includes a cover body and a cover lateral plate surrounding a periphery of the cover body. The cover body and the cover lateral plate define a mounting chamber 102 with an open side. The first portion 110 is configured as the cover lateral plate, and the second portion 120 is configured as the cover body, so as to make the appearance of the conductive cover 100 more expressive. In an example of the present disclosure, as illustrated in FIG. 1, two slots 101 can be defined in the conductive cover 100 and divide the conductive cover 100 into two first portions 110 and one second portion 120. The two first portions 110 are located at upper and lower ends of the second portion 120. One conductive suspended strip 130 can be arranged in one slot 101.

Figure 4:
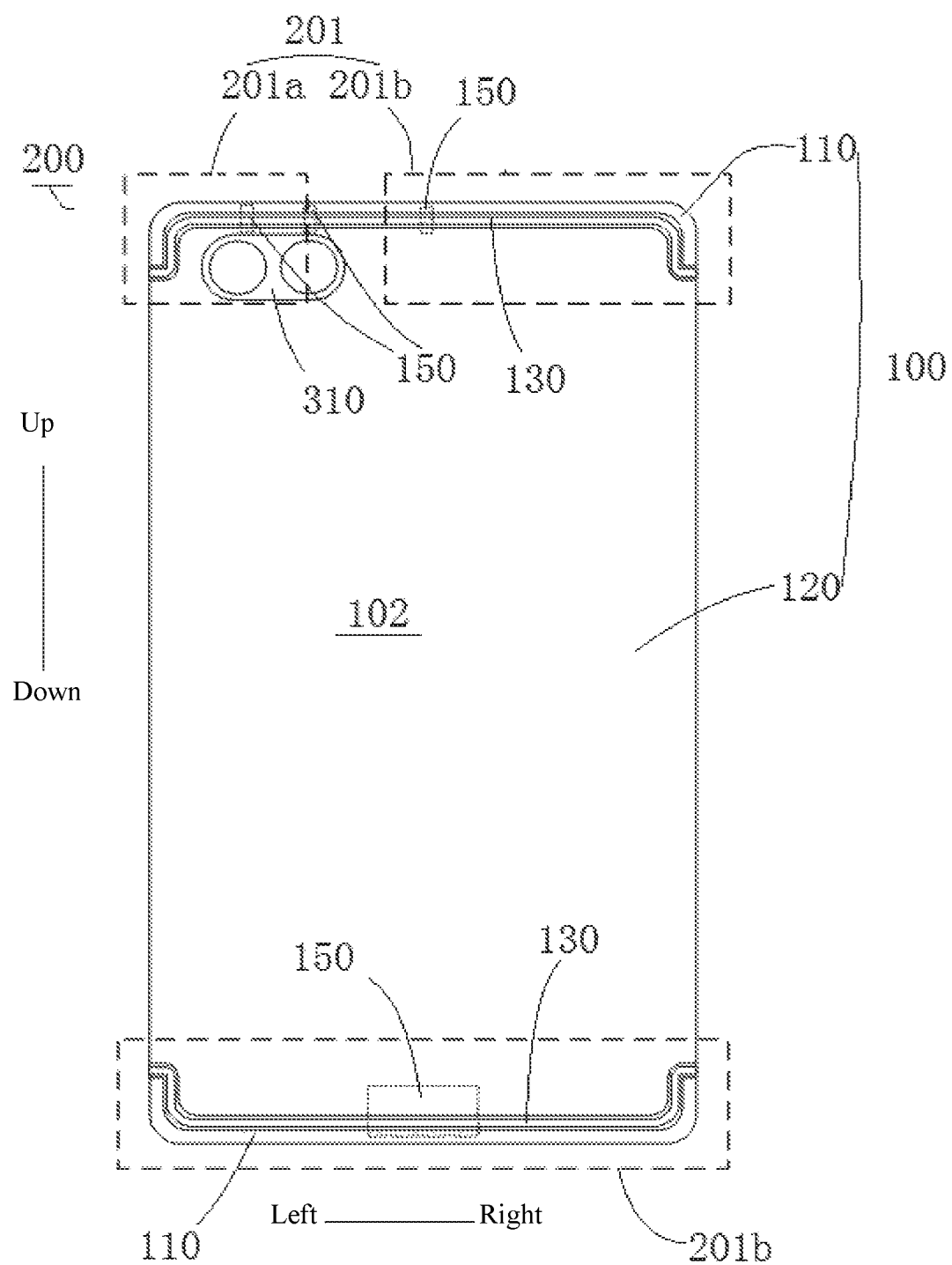
FIG. 4 is a schematic view of a housing assembly for a terminal according to an embodiment of the present disclosure.

The housing assembly 200 for the terminal 300 according to embodiments of the present disclosure includes the above conductive cover 100. The conductive cover 100 is divided into a plurality of spaced signal areas 201. FIG. 4 illustrates that each of the plurality of signal areas 201 includes a part of the first portion 110, a part of the second portion 120 and a part of the conductive suspended strip 130. Each signal area 201 includes at least one conductive connecting member 150. The signal area 201 is capable of enabling the terminal 300 to communicate with other devices. For example, the signal area 201 can be a GPS/Wi-Fi (global position system/wireless fidelity) antenna area 201a, an NFC (near field communication) antenna area, a communication antenna area 201b or the like.

As illustrated in FIG. 4, one GPS/Wi-Fi antenna area 201a can be provided and located at the upper left of the housing assembly 200 (e.g. a location illustrated in FIG. 4). Two communication antenna areas 201b can be provided, and one of the two communication antenna areas is located at a lower end of the housing assembly 200 while the other one of the two communication antenna areas is located at the upper right of the housing assembly 200 (e.g. a location illustrated in FIG. 4). One inductor, one matching circuit and one signal source are arranged in the GPS/Wi-Fi antenna area 201a. One end of the inductor is connected with the first portion, the other end of the inductor is connected with one end of the matching circuit, and the other end of the matching circuit is connected with the signal source. An antenna in the communication antenna area 201b can adopt an IFA mode or a capacitive feed mode. One inductor, one matching circuit, one signal source and two antenna switches 230 can arranged in each communication antenna area 201b. One end of the inductor is connected with the first portion, the other end of the inductor is connected with one end of the matching circuit, and the other end of the matching circuit is connected with the signal source. One end of each antenna switch 230 is connected with the first portion, and the other end of each antenna switch 230 is connected with a ground point 240.

For the housing assembly 200 for the terminal 300 according to embodiments of the present disclosure, by arranging the conductive suspended strip 130 in the slot 101 of the conductive cover 100, by electrically connecting the first portion 110 with the second portion 120 through the conductive connecting member 150, and by connecting the conductive connecting member 150 with the conductive suspended strip 130 in the insulating manner, the signal radiation capability of the first portion 110 or the second portion 120 can be enhanced, and the conductive suspended strip 130 can be prevented from interfering with the signal radiation, so as to improve the anti-interference capability of the antenna, and enhance the antenna signal strength.

Figure 5:
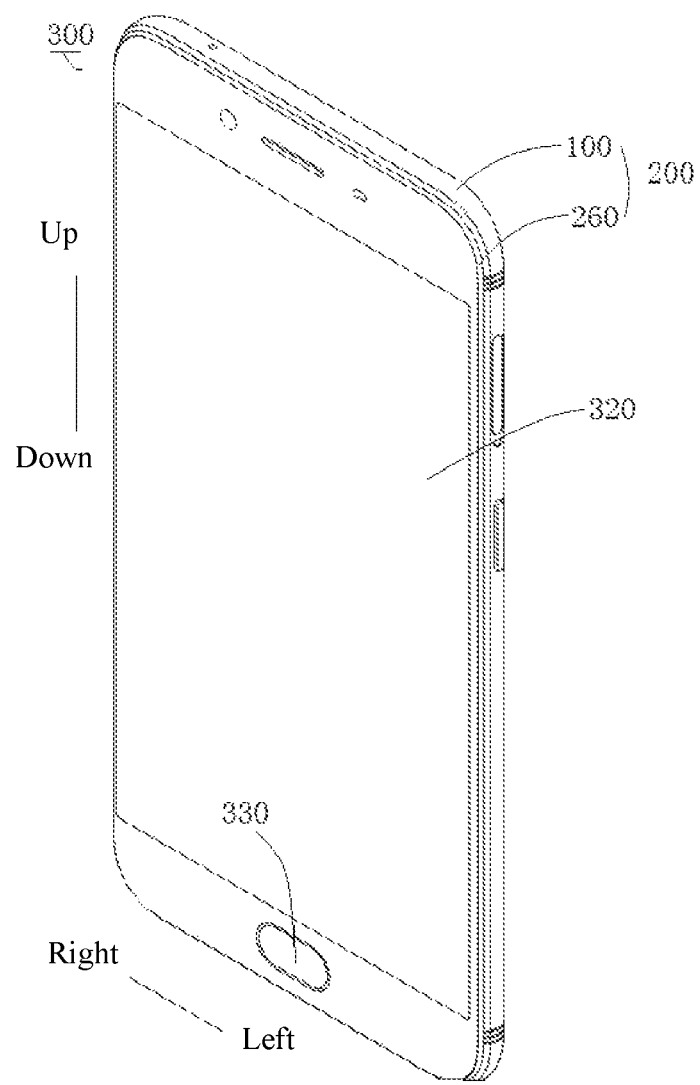
FIG. 5 is a schematic view of a terminal according to an embodiment of the present disclosure.

FIG. 5 illustrates the terminal 300 according to embodiments of the present disclosure, the terminal 300 includes: a camera assembly 310, a first antenna circuit A, a second antenna circuit B, and the above housing assembly 200.

Specifically, with reference to FIG. 3 and FIG. 4, the first antenna circuit A is located in one of the plurality of signal areas 201 and includes a first signal source 220a, a first matching circuit 210a and a first inductor 250a. One end of the first inductor 250a is electrically connected with the first portion 110, the other end of the first inductor 250a is electrically connected with one end of the first matching circuit 210a, and the other end of the first matching circuit 210a is electrically connected with the first signal source 220a. The second antenna circuit B is located in another one of the plurality of signal areas 201 and includes a second signal source 220b, a second matching circuit 210b and a second inductor 250b. One end of the second inductor 250b is electrically connected with the first portion 110, the other end of the second inductor 250b is electrically connected with one end of the second matching circuit 210b, and the other end of the second matching circuit 210b is electrically connected with the second signal source 220b.

By connecting the first portion 110 through the first antenna circuit A and the second antenna circuit B, the first portion 110 can serve as the antenna component, thereby simplifying the structure of the terminal 300, and improving the radiation capability and the anti-interference capability of the antenna. In addition, the first antenna circuit A and the second antenna circuit B can be configured to carry out signal transmission with no need for any frequency band, so as to improve a signal transmission capability and an information interaction capability of the terminal 300.

Additionally, it should be noted that the number of antenna circuits of the terminal 300 is not limited to two. For instance, FIG. 3 illustrates an example, the terminal 300 can further include a third antenna circuit C, in which a frequency band of a signal radiated from the third antenna circuit C can be different from that of the first antenna circuit A and that of the second antenna circuit B, or can be the same as one of that of the first antenna circuit A and that of the second antenna circuit B. The third antenna circuit C includes a third signal source 220c and a third matching circuit 210c, one end of the third matching circuit 210c is electrically connected with the third signal source 220c, and the other end of the third matching circuit 210c is electrically connected with the first portion 110.

The camera assembly 310 is arranged adjacent to the first antenna circuit A or the second antenna circuit B. That is, the camera assembly 310 can be located adjacent to the first antenna circuit A, or can be located adjacent to the second antenna circuit B.

It should be noted that the signal area 201 is capable of enabling the terminal 300 to communicate with other devices, and the signal area 201 can be the GPS/Wi-Fi antenna area 201a, the NFC antenna area, the communication antenna area 201b or the like. It is possible to enhance the anti-interference capability of the antenna by arranging the camera assembly 310 in one of the plurality of signal areas 201.

It should be noted that the terminal used herein (also referred to as a communication terminal) includes, but is not limited to, a device configured to be connected via a wired connection (such as a public switched telephone network (PSTN), a digital subscriber line (DSL), a digital cable, a direct cable connection, and/or another data connection/network) and/or receive/transmit a communication signal via a wireless interface (e.g., for a cellular network, a wireless local area network (WLAN), a digital television network such as a DVB-H network, a satellite network, an AM-FM broadcast transmitter, and/or another communication terminal). A communication terminal configured to communicate via the wireless interface can be referred to as "a wireless communication terminal," "a wireless terminal" and/or "a mobile terminal." Examples of the mobile terminal include but are not limited to a satellite or cellular telephone; a personal communication system (PCS) terminal capable of combining cellular radiotelephone with data processing, facsimile and data communication capabilities; a PDA integrated with a radiotelephone, a pager, an Internet/Intranet access, a Web browser, a notebook, a calendar, and/or a global positioning system (GPS) receiver; and conventional laptop and/or palmtop receivers or other electronic devices including radiotelephone transceivers.

For the terminal 300 according to embodiments of the present disclosure, by providing the conductive suspended strip 130 in the slot 101 of the conductive cover 100, by electrically connecting the first portion 110 with the second portion 120 through the conductive connecting member 150, and by connecting the conductive connecting member 150 with the conductive suspended strip 130 in the insulating manner, the signal radiation capability of the first portion 110 or the second portion 120 can be enhanced, and the conductive suspended strip 130 can be prevented from interfering with the signal radiation, so as to improve the anti-interference capability of the antenna, and enhance the antenna signal strength.

FIGS. 3 and 5 illustrates an embodiment according to the present disclosure, one of the plurality of signal areas 201 can be the GPS/Wi-Fi antenna area 201a, and the camera assembly 310 is located in the GPS/Wi-Fi antenna area 201a. It is verified by tests that when the camera assembly 310 is located in the GPS/Wi-Fi antenna area 201a, a GPS/Wi-Fi antenna has the best antenna performance and the strongest anti-interference capability. In an embodiment according to the present disclosure, the camera assembly 310 can be a single camera or a dual camera, thereby increasing diversity of the terminal 300.

According to an embodiment of the present disclosure, the first antenna circuit A can be a GPS/Wi-Fi antenna circuit, and the camera assembly 310 is located adjacent to the first antenna circuit A. Thus, it is possible to enhance the signal radiation capability and the anti-interference capability of the first antenna circuit A.

FIG. 5 illustrates a mobile phone taken as an example of the terminal 300 to which the present disclosure is adapted. In embodiments of the present disclosure, the mobile phone can include a radio frequency circuit, a memory, an input unit, a wireless fidelity (Wi-Fi) module, a display screen assembly 320, a sensor, an audio circuit, a processor, a projection unit, the camera assembly 310, a battery and other components.

A radio frequency (RF) circuit can be used to receive and transmit a signal during information transmission and reception or during a call. Especially, when downlink information from a base station is received, the RF circuit sends the downlink information to the processor for being processed, and additionally sends uplink data from the mobile phone to the base station. Usually, the RF circuit includes but is not limited to an antenna, at least one amplifier, a transceiver, a coupler, a low noise amplifier, a duplexer and etc. In addition, the RF circuit can communicate with the network and other devices via wireless communication. The wireless communication can employ any communication standard or protocol, including but not limited to global system for mobile communication (GSM), general packet radio service (GPRS), code division multiple access (CDMA), wideband code division multiple access (WCDMA), long term evolution (LTE), e-mail and short messaging service (SMS).

The memory can be used to store software programs and modules, and the processor runs various software applications and performs data processing by running the software programs and modules stored in the memory. The memory can mainly include a program storage area and a data storage area. The program storage area can store an operating system, at least one application program required for a function (such as a voice playback function, an image playback function and etc.); the data storage area can store data (such as audio data, contacts and etc.) created according to the use of the mobile phone. In addition, the memory can include a high-speed random access memory, and can also include a non-volatile memory, such as at least one disk storage device and flash memory device, or include other volatile solid state memory devices.

The input unit can be configured to receive incoming numbers or character information, and generate a key signal related to user settings and function control of the mobile phone. Specifically, the input unit can include a touch panel and other input devices. The touch panel, also known as a touch screen, can collect a touch operation made by a user on or near the touch panel (for example, an operation made by the user on the touch panel or near the touch panel by means of a finger, a touch pen or any other suitable object or accessory), and drive the corresponding connection device according to a preset program. Optionally, the touch panel can include a touch detection device and a touch controller. The touch detection device is configured to detect a touch orientation of the user, detect a signal from the touch operation, and transmit the signal to the touch controller. The touch controller is configured to receive the touch signal from the touch detection device, convert it into contact coordinates and send the contact coordinates to the processor and can be configured to receive and execute a command from the processor. In addition, it is possible to touch the panel in resistive type, capacitive type, infrared type, surface acoustic wave and other types of manner. The input unit can include other input devices apart from the touch panel. Specifically, other input devices can include, but are not limited to one or more of a physical keypad, a function key (e.g. a volume control button, a power button, etc.), a trackball, a mouse and an operating rod.

The housing assembly 200 includes the conductive cover 100 and a front cover 260. The conductive cover 100 and the front cover 260 define the mounting chamber 102, the display screen assembly 320 is embedded on the front cover 260, and the display screen assembly 320 can display information input by or presented to the user, and various menus of the mobile phone. The display screen assembly 320 can include a display panel, and optionally, the display panel can be configured in forms of a liquid crystal display (LCD), an organic light-emitting diode (OLED) and the like. Further, the touch panel can overlay the display panel. When the touch panel detects a touch operation on or near it, the touch operation is sent to the processor to be determined which type the touch event belongs to, and then the processor provides corresponding visual output on the display panel according to the type of the touch event.

The location, which can be recognized by the user's eye in the display panel, besides the visual output, can serve as a "display area" described later. The touch panel and the display panel can be two separate components to achieve input and output functions of the mobile phone, or can be integrated to achieve the input and output functions of the mobile phone.

In addition, the mobile phone can also include at least one sensor, such as an attitude sensor, a light sensor, a fingerprint identification assembly 330 and other sensors.

Specifically, the attitude sensor can also be referred to as a motion sensor, and as one of the motion sensors, a gravity sensor can be employed. As for the gravity sensor, a cantilever displacement device is made of an elastic-sensitive element, and an electrical contact is driven by an energy-storage spring made of the elastic-sensitive element, so as to achieve the conversion of gravity changes into electrical signal changes.

As an alternative motion sensor, an accelerometer sensor can be used. The accelerometer sensor can detect the magnitude of acceleration in all directions (generally in three axes), and detect the magnitude and direction of the gravity at rest, and can be used for attitude identification of the mobile phone (such as horizontal and vertical screen switch, related games, magnetometer attitude calibration), and vibration-recognition related functions (such as pedometer and percussion).

In embodiments of the present disclosure, the motion sensors listed above can be used as an element for obtaining an "attitude parameter" described later, which is not limited thereto, however. Other sensors capable of obtaining the "attitude parameter" fall into the protection scope of the present disclosure, for example, a gyroscope. The working principle and data processing of the gyroscope can be similar to the related art, so the detailed description thereof will be omitted to avoid redundancy.

In addition, in the embodiments of the present disclosure, a barometer, a hygrometer, thermometer, an infrared sensor and the like can be used as a sensor, which is not described in detail.

The light sensor can include an ambient light sensor and a proximity sensor, in which the ambient light sensor can adjust brightness of the display panel in accordance with the ambient light, and the proximity sensor can turn off the display panel and/or backlight when the mobile phone is moved to the ear.

The audio circuit, a loudspeaker and a microphone can provide an audio interface between the user and the mobile phone. The audio circuit can transmit an electrical signal converted from the received audio data to the loudspeaker, and the loudspeaker converts the electrical signal into an audio signal to be output. On the other hand, the microphone converts the audio signal collected into the electrical signal, the audio circuit receives and converts the electrical signal into audio data, and transmits the audio data to the processor. After processed by the processor, the audio data is sent to another mobile phone via the RF circuit, or output to the memory for further processing.

Wi-Fi is a short distance wireless transmission technology, and the mobile phone can help the user send and receive e-mails, browse websites and access streaming media through the Wi-Fi module which provides the user with wireless broadband access to the Internet.

The processor is a control center of the mobile phone, is connect to various parts of the mobile phone by means a variety of interfaces and lines to, and performs various functions of the mobile phone and data processing by running or executing software programs and/or modules stored in the memory and by invoking the data stored in the memory, so as to monitor the mobile phone overall. In at least one embodiment, the processor can include one or more processing units; preferably, the processor can be integrated with an application processor and a modem processor, in which the application processor mainly handles the operating system, the user interface and the application program, while the modem processor mainly deals with wireless communication.

It should be understood that the modem processor may not be integrated into the processor.

Moreover, the processor can act as an implementing element of the processing unit, to perform the same or similar function as the processing unit.

The mobile phone further includes a power source (e.g. a battery) that supplies power to each component. The power source can be logically coupled to the processor through a power management system, so as to achieve the management of charging, discharging, and power consumption and other functions by means of the power management system. Although not illustrated, the mobile phone can include a Bluetooth module or the like, which will not be elaborated herein.

It should be noted that the mobile phone is only a device example of the terminal 300 and is not constructed to limit the present disclosure. The present disclosure can be applied to an electronic device such as a mobile phone, a tablet computer and so on, and the present disclosure is not limited thereto.

Reference throughout this specification to "an embodiment," "some embodiments," "an example," "a specific example" or "some examples" means that a particular feature, structure, material, or characteristic described in connection with the embodiment or example is included in at least one embodiment or example of the present disclosure.

Thus, the appearances of the above phrases throughout this specification are not necessarily referring to the same embodiment or example of the present disclosure. Furthermore, the particular features, structures, materials, or characteristics can be combined in any suitable manner in one or more embodiments or examples.

Although embodiments of the present disclosure have been illustrated and described, it would be appreciated by those skilled in the art that the embodiments are explanatory and cannot be construed to limit the present disclosure, and changes, modifications, alternatives and variations can be made in the embodiments without departing from the scope of the present disclosure.

What is claimed is:

1. A conductive cover for a terminal, comprising:
   a first portion;
   a second portion, a slot being defined between the second portion and the first portion to partition the first portion from the second portion;
   a conductive suspended strip, located in the slot and having a length equal to a length of the slot, an insulating layer being provided between the conductive suspended strip and the first portion, and another insulating layer being provided between the conductive suspended strip and the second portion, the insulating layer having a thickness ranging from 0.1 mm to 0.5 mm; and
   a conductive connecting member, bridging over the slot, electrically connected with the first portion and the second portion, and insulated from the conductive suspended strip.

2. The conductive cover according to claim 1, wherein the conductive suspended strip comprises:
   two first horizontal segments spaced apart;
   a second horizontal segment, located between the two first horizontal segments, and located at a side of the two first horizontal segments and parallel to the two first horizontal segments; and
   two vertical connecting segments, extending in a direction perpendicular to an extension direction of the two first horizontal segments, and each having two ends connected to one corresponding first horizontal segment and the second horizontal segment.

3. The conductive cover according to claim 2, wherein each of the two first horizontal segments has a side wall surface facing the first portion, and the side wall surface facing the first portion and one corresponding vertical connecting segment are at a right angle.

4. The conductive cover according to claim 2, wherein each of the two first horizontal segments has a side wall surface facing the second portion, and the side wall surface facing the second portion and one corresponding vertical connecting segment are at a rounded angle.

5. The conductive cover according to claim 2, wherein the second horizontal segment and each of the two vertical connecting segments are provided with a smooth-transition connecting portion therebetween.

6. The conductive cover according to claim 1, wherein a plurality of the conductive connecting members are provided and spaced apart from each other along a length direction of the slot.

7. The conductive cover according to claim 1, wherein the conductive cover comprises a cover body and a cover lateral plate surrounding a periphery of the cover body, the cover body and the cover lateral plate define a mounting chamber with an open side, the first portion is configured as the cover lateral plate, and the second portion is configured as the cover body.

8. The conductive cover according to claim 1, wherein two slots are defined in the conductive cover and divide the conductive cover into two first portions and one second portion, the two first portions are located at upper and lower ends of the second portion, and one conductive suspended strip is arranged in one slot.

9. A housing assembly for a terminal, comprising a conductive cover, the conductive cover comprising:
   a first portion;
   a second portion, a slot being defined between the second portion and the first portion to partition the first portion from the second portion;
   a conductive suspended strip, located in the slot and having a length equal to a length of the slot, an insulating layer being provided between the conductive suspended strip and the first portion, and another insulating layer being provided between the conductive suspended strip and the second portion, the insulating layer having a thickness ranging from 0.1 mm to 0.5 mm; and
   a conductive connecting member, bridging over the slot, electrically connected with the first portion and the second portion, and insulated from the conductive suspended strip, the conductive cover being divided into a plurality of spaced signal areas, and each of the plurality of signal areas comprising a part of the first portion, a part of the second portion and a part of the conductive suspended strip.

10. The housing assembly according to claim 9, wherein one of the plurality of signal areas is configured as a GPS/Wi-Fi (global position system/wireless fidelity) antenna area, an NFC (near field communication) antenna area, or a communication antenna area.

11. The housing assembly according to claim 9, wherein the plurality of signal areas comprises one GPS/Wi-Fi antenna area and two communication antenna areas.

12. The housing assembly according to claim 11, wherein the GPS/Wi-Fi antenna area is arranged at a first corner area of a first end of the housing assembly, one of the two communication antenna areas is arranged at a second corner area of the first end of the housing assembly, and the other one of the two communication antenna areas is arranged at a second end of the housing assembly.

13. A terminal, comprising:
   a housing assembly having a conductive cover, wherein the conductive cover comprises:
      a first portion;
      a second portion, a slot being defined between the second portion and the first portion to partition the first portion from the second portion;
      a conductive suspended strip, located in the slot and having a length equal to a length of the slot, an insulating layer being provided between the conductive suspended strip and the first portion, and another insulating layer being provided between the conductive suspended strip and the second portion, the insulating layer having a thickness ranging from 0.1 mm to 0.5 mm;
      a conductive connecting member, bridging over the slot, electrically connected with the first portion and the second portion, and insulated from the conductive suspended strip, the conductive cover being divided into a plurality of spaced signal areas, and each of the plurality of signal areas comprising a part of the first portion, a part of the second portion and a part of the conductive suspended strip;

a first antenna circuit, located in one of the plurality of signal areas and comprising a first signal source, a first matching circuit and a first inductor, the first inductor having two ends, the first matching circuit having two ends, one end of the first inductor being electrically connected with the first portion, the other end of the first inductor being electrically connected with one end of the first matching circuit, and the other end of the first matching circuit being electrically connected with the first signal source;

a second antenna circuit, located in another one of the plurality of signal areas and comprising a second signal source, a second matching circuit and a second inductor, the second inductor having two ends, the second matching circuit having two ends, one end of the second inductor being electrically connected with the first portion, the other end of the second inductor being electrically connected with one end of the second matching circuit, and the other end of the second matching circuit being electrically connected with the second signal source; and a camera assembly arranged adjacent to the first antenna circuit or the second antenna circuit.

14. The terminal according to claim 13, wherein the first antenna circuit is configured as a GPS/Wi-Fi antenna circuit, and the camera assembly is located adjacent to the first antenna circuit.

15. The terminal according to claim 13, wherein the camera assembly is configured as a single camera or a dual camera.

16. The terminal according to claim 13, wherein one of the plurality of signal areas is configured as a communication antenna area, and the camera assembly is located in the communication antenna area.

17. The terminal according to claim 13, further comprising a third antenna circuit, the third antenna circuit comprising a third signal source and a third matching circuit, the third matching circuit having an end electrically connected with the third signal source and another end electrically connected with the first portion.

18. The terminal according to claim 17, wherein the third antenna circuit radiates a signal at a frequency band different from that of the first antenna circuit and that of the second antenna circuit.

19. The terminal according to claim 17, wherein the third antenna circuit radiates a signal at a frequency band the same as one of that of the first antenna circuit and that of the second antenna circuit.

* * * * *